US012757634B2

(12) United States Patent
Kononchuk et al.

(10) Patent No.: US 12,757,634 B2
(45) Date of Patent: Oct. 6, 2026

(54) HYBRID STRUCTURE FOR A SURFACE ACOUSTIC WAVE DEVICE

(71) Applicant: Soitec, Bernin (FR)

(72) Inventors: Oleg Kononchuk, Bernin (FR); Eric Butaud, Grenoble (FR); Eric Desbonnets, Lumbin (FR)

(73) Assignee: Soitec, Bernin (FR)

( * ) Notice: Subject to any disclaimer, the term of this patent is extended or adjusted under 35 U.S.C. 154(b) by 146 days.

(21) Appl. No.: 18/790,903

(22) Filed: Jul. 31, 2024

(65) Prior Publication Data

US 2024/0397825 A1 Nov. 28, 2024

Related U.S. Application Data

(63) Continuation of application No. 17/649,470, filed on Jan. 31, 2022, now Pat. No. 12,108,678, which is a
(Continued)

(30) Foreign Application Priority Data

Feb. 1, 2016 (FR) ...................................... 1650774

(51) Int. Cl.
*H10N 30/072* (2023.01)
*H03H 3/02* (2006.01)
(Continued)

(52) U.S. Cl.
CPC ............ *H10N 30/072* (2023.02); *H03H 3/02* (2013.01); *H03H 9/0009* (2013.01);
(Continued)

(58) Field of Classification Search
CPC . H10N 30/708; H03H 9/0009; H03H 9/02047
See application file for complete search history.

(56) References Cited

U.S. PATENT DOCUMENTS

| | | | |
|---|---|---|---|
| 3,887,887 A | 6/1975 | Wagers et al. |
| 2002/0135270 A1 | 9/2002 | Ballandras et al. |

(Continued)

FOREIGN PATENT DOCUMENTS

| | | |
|---|---|---|
| CA | 2384275 A1 | 1/2002 |
| CN | 102624352 B | 12/2015 |

(Continued)

OTHER PUBLICATIONS

Abbott et al., Characterization of bonded wafer for RF filters with reduced TCF, Proc. 2005 IEEE International Ultrasonics Symposium, Sep. 19-21, 2005, pp. 926-929.

(Continued)

*Primary Examiner* — Bryan P Gordon
(74) *Attorney, Agent, or Firm* — TraskBritt

(57) ABSTRACT

The disclosure relates to a hybrid structure for a surface-acoustic-wave device comprising a useful layer of piezoelectric material joined to a carrier substrate having a thermal expansion coefficient lower than that of the useful layer; the hybrid structure comprising an intermediate layer located between the useful layer and the carrier substrate, the intermediate layer being a structured layer formed from at least two different materials comprising a plurality of periodic motifs in the plane of the intermediate layer.

20 Claims, 3 Drawing Sheets

Related U.S. Application Data continuation of application No. 16/072,587, filed as application No. PCT/FR2017/050092 on Jan. 17, 2017, now Pat. No. 11,335,847.

(51) Int. Cl.

| | |
|---|---|
| ***H03H 9/00*** | (2006.01) |
| ***H03H 9/02*** | (2006.01) |
| ***H10N 30/00*** | (2023.01) |

(52) U.S. Cl.

CPC .... *H03H 9/02047* (2013.01); *H03H 9/02574* (2013.01); *H10N 30/708* (2024.05)

(56) References Cited

U.S. PATENT DOCUMENTS

| | | | | |
|---|---|---|---|---|
| 2007/0007851 | A1 | 1/2007 | Loebl et al. | |
| 2010/0187949 | A1 | 7/2010 | Pahl et al. | |
| 2012/0086312 | A1 | 4/2012 | Kobayashi et al. | |
| 2012/0094270 | A1 | 4/2012 | Mutharasan et al. | |
| 2012/0319530 | A1 | 12/2012 | Burak et al. | |
| 2012/0319534 | A1 | 12/2012 | Shirakawa et al. | |
| 2013/0063226 | A1 | 3/2013 | Burak et al. | |
| 2013/0106248 | A1* | 5/2013 | Burak .................... | H03H 9/173 310/360 |
| 2013/0106534 | A1* | 5/2013 | Burak .................... | H03H 9/173 333/187 |
| 2013/0153924 | A1 | 6/2013 | Chandran et al. | |
| 2018/0175821 | A1 | 6/2018 | Sadhu et al. | |
| 2019/0157137 | A1* | 5/2019 | Desbonnets ........... | H10D 86/01 |
| 2019/0372243 | A1* | 12/2019 | Desbonnets ........... | H01Q 23/00 |

FOREIGN PATENT DOCUMENTS

| | | | |
|---|---|---|---|
| CN | 103283147 | B | 9/2016 |
| DE | 102007037502 | A1 | 2/2009 |
| EP | 1158671 | A2 | 11/2001 |
| EP | 2658122 | A1 | 10/2013 |
| JP | 50-099249 | A | 8/1975 |
| JP | 62-040811 | A | 2/1987 |
| JP | 07-176975 | A | 7/1995 |
| JP | 08-097675 | A | 4/1996 |
| JP | 2001-053579 | A | 2/2001 |
| JP | 2001-196896 | A | 7/2001 |
| JP | 2008-006766 | A | 1/2008 |
| JP | 2010-536217 | A | 11/2010 |
| JP | 2012-085286 | A | 4/2012 |
| WO | 2005/036150 | A1 | 4/2005 |
| WO | 2009/019308 | A2 | 2/2009 |
| WO | 2014/027538 | A1 | 2/2014 |

OTHER PUBLICATIONS

Chinese First Office Action and Search Report for Chinese Application No. 201780006874.X dated Nov. 2, 2021.

French Search Report and Written Opinion for FR Application No. FR1650774, dated Nov. 14, 2016, 11 pages with english translation.

Hanada, T., Basic Properties of Zn0, GaN, and Related Materials, Oxide and Nitride Semiconductors, (Jan. 1, 2009), pp. 1-19.

Hashimoto et al., Recent Development of Temperature Compensated SAW Devices, Ultrasonics Symposium, 2011 IEEE International, Oct. 18, 2011, pp. 79-86.

International Search Report for International Application No. PCT/FR2017/050092 dated May 10, 2017, 3 pages.

International Written Opinion for International Application No. PCT/FR2017/050092 dated May 10, 2017, 5 pages.

Japanese Decision to Grant for Japanese Application No. 2018-539954 dated Apr. 19, 2021, 5 pages with English Translation.

Japanese Official Notice of Rejection for Japanese Application No. 2018/539954 dated Sep. 1, 2020.

Japanese Patent Application No. 2021-044722 dated Feb. 22, 2022, 6 pages.

* cited by examiner

HYBRID STRUCTURE FOR A SURFACE ACOUSTIC WAVE DEVICE

CROSS-REFERENCE TO RELATED APPLICATIONS

This application is a continuation of U.S. patent application Ser. No. 17/649,470 filed Jan. 31, 2022, now U.S. Pat. No. 12,108,678, issued Oct. 1, 2024, which is a continuation of U.S. patent application Ser. No. 16/072,587, filed Jul. 25, 2018, now U.S. Pat. No. 11,335,847, issued May 17, 2022, which is a national phase entry under 35 U.S.C. § 371 of International Patent Application PCT/FR2017/050092, filed Jan. 17, 2017, designating the United States of America and published as International Patent Publication WO 2017/134357 A1 on Aug. 10, 2017, which claims the benefit under Article 8 of the Patent Cooperation Treaty and under 35 U.S.C. § 119(e) to French Patent Application Serial No. 16/50774, filed Feb. 1, 2016, the disclosure of each of which is hereby incorporated herein in its entirety by this reference.

TECHNICAL FIELD

The present application relates to the field of surface acoustic wave devices. It particularly relates to a hybrid structure suitable for manufacturing surface acoustic wave devices.

BACKGROUND

Acoustic resonator structures such as surface acoustic wave (SAW) devices use one or several interdigital transducers produced on a piezoelectric substrate in order to convert electrical signals into acoustic waves and vice versa. SAW devices or resonators of this kind are often used in filtering applications. Radiofrequency (RF) SAW technology provides excellent performances including a high level of insulation and low insertion losses. This is why it is used for RF duplexers in wireless communication applications. Nevertheless, in order to be more competitive versus RF duplexers based on bulk acoustic wave (BAW) technology, the performance of the RF SAW devices needs to be improved and it is required, in particular, that the frequency response be temperature-stable.

The temperature dependence of the operating frequency of SAW devices, or the temperature coefficient of frequency (TCF), depends, on the one hand, on variations in the spacing between the interdigital electrodes of the transducers, which are generally due to the relatively high coefficients of thermal expansion (CTE) of the piezoelectric substrates used, and on the other hand, the TCF depends on the thermal velocity coefficient, since expansion or contraction of the piezoelectric substrate is accompanied by an increase or decrease in the surface acoustic wave velocity. In order to minimize the temperature coefficient of frequency (TCF), an objective is, therefore, to minimize the expansion/contraction of the piezoelectric substrate, particularly in the surface area in which the acoustic waves will propagate.

The article by K. Hashimoto, M. Kadota et al., "Recent development of temperature-compensated SAW devices," *IEEE Ultrason. Symp.* 2011, pages 79-86, provides an overview of the approaches commonly used to overcome the temperature dependence problem of the frequency response of SAW devices.

The first approach involves covering the surface of the piezoelectric substrate comprising the metallic structure of the transducers with a layer of silicon oxide ($SiO_2$). The very low CTE of $SiO_2$ limits the temperature expansion/contraction of the piezoelectric substrate. Although it improves temperature performance, this approach has limitations. On the one hand, the temperature constraints for applying this oxide layer (given the presence of metals) only provide access to relatively poor-quality materials with limited acoustic performance. On the other hand, with this approach, the final thickness of the piezoelectric substrate must be greater than 200 microns to guarantee the mechanical strength of the structure, which restricts the final packaging possibilities of the device.

The second approach involves using a hybrid substrate composed, for instance, of a layer of piezoelectric material applied to a silicon substrate. In this case, the low CTE of silicon also limits the temperature expansion/contraction of the piezoelectric layer. In the case of a piezoelectric layer of Lithium Tantalate ($LiTaO_3$), the article mentioned above indicates that a ratio of 10 between the $LiTaO_3$ thickness and the thickness of the silicon substrate suitably improves the temperature coefficient of frequency (TCF). One of the drawbacks of this approach lies in the presence of parasitic acoustic waves (known as "spurious acoustic modes" in the article "Characterization of bonded wafer for RF filters with reduced TCF," B. P. Abbott et al., Proc. 2005 *IEEE International Ultrasonics Symposium*, Sep. 19-21, 2005, pp. 926-929), which negatively impact the frequency characteristics of the resonator produced on the hybrid substrate. These spurious resonances are particularly related to spurious reflections of the main acoustic wave (propagating mainly in a superficial area of the $LiTaO_3$ layer) on the underlying interfaces including, in particular, the interface between the $LiTaO_3$ and silicon. A solution in order to reduce these spurious resonances involves increasing the thickness of the layer of $LiTaO_3$. Since this implies an increase in the thickness of the Si substrate in order to maintain the improvements in the TCF, the total thickness of the hybrid substrate is no longer compatible with the requirements for reducing the thickness of the final components, notably to address the cell phone market. Another solution, proposed by K. Hashimoto et al. (article previously mentioned), involves roughening the lower surface of the layer of $LiTaO_3$ (at the bonding interface with the substrate) so as to limit the reflections of the acoustic wave on the surface.

BRIEF SUMMARY

An aim of the present disclosure is to provide an alternative solution to the state-of-the-art solutions. An aim of the disclosure particularly involves providing a hybrid structure allowing reduction and/or elimination of the spurious acoustic waves.

This disclosure relates to a hybrid structure for a surface acoustic wave device comprising a useful layer of piezoelectric material joined to a carrier substrate having a thermal expansion coefficient lower than that of the useful layer, wherein the hybrid structure comprises an intermediate layer located between the useful layer and the carrier substrate, the intermediate layer being a structured layer formed of at least two different materials having a plurality of periodic motifs in the plane of the intermediate layer.

The lateral dimensions, the periodicity of the motifs in the plane of the intermediate layer and the thickness of the intermediate layer are defined according to the frequency of the acoustic wave characteristic of the SAW device in order to transmit or diffuse the acoustic waves normally reflected on the interfaces of the hybrid structure. The presence of the intermediate layer in the hybrid structure therefore drastically reduces the parasitic reflections of the acoustic wave that negatively impact the frequency characteristics of the SAW device.

According to advantageous characteristics of the disclosure, taken either separately or in combination:

- the periodicity of the motifs is selected according to the frequency of the surface acoustic waves of the device;
- the carrier substrate comprises a material selected from among silicon, glass, silica, sapphire, alumina and aluminum nitride;
- the useful layer comprises a piezoelectric material selected from among lithium tantalate ($LiTaO_3$), lithium niobate ($LiNbO_3$), quartz and zinc oxide (ZnO);
- the mean acoustic impedance of the intermediate layer is substantially equal to the square root of the product of the acoustic impedances of the useful layer and of the carrier substrate;
- the thickness of the intermediate layer is greater than the wavelength of the surface acoustic waves of the device;
- at least one lateral dimension of the motifs is smaller than the wavelength of the surface acoustic waves of the device;
- the periodic motifs comprise an alternation of a first motif composed of the material of the useful layer and of a second motif composed of a material of the same type as that of the carrier substrate;
- the second motif is composed of polycrystalline silicon and the carrier substrate is made of silicon;
- the thickness of the intermediate layer is equal to or substantially less than the wavelength of the surface acoustic waves of the device;
- at least one lateral dimension of the motifs is less than or equal to the wavelength of the surface acoustic waves of the device;
- the periodic motifs comprise an alternation of a first motif composed of the material of the useful layer or of the material of the carrier substrate and of a second motif composed of another material; and
- the second motif is composed of silicon dioxide, of silicon nitride.

The disclosure also relates to a method of manufacturing a hybrid structure for a surface acoustic wave device remarkable in that it comprises the following stages:

i) Providing a useful layer of piezoelectric material and a carrier substrate having a thermal expansion coefficient lower than that of the useful layer;

ii) Local etching according to periodic motifs of a front face of the useful layer or carrier substrate, forming a set of etched motifs and unetched motifs of a first material;

iii) Applying to the etched motifs an additional layer of a second material different from the first material, wherein the unetched periodic motifs and the additional layer form an intermediate layer;

iv) Assembling the useful layer and the carrier substrate such that the intermediate layer is arranged between the useful layer and the carrier substrate.

According to advantageous characteristics of the disclosure, taken either separately or in combination:

- the useful layer provided at stage i) is a piezoelectric material donor substrate;
- the method comprises a stage v) of thinning the donor substrate to the desired thickness of the useful layer for manufacture of the acoustic wave device.

BRIEF DESCRIPTION OF THE DRAWINGS

Further characteristics and advantages of the disclosure will be clear from the following detailed description, made in reference to the accompanying figures, in which.

DETAILED DESCRIPTION

In the descriptive section, the same references in the figures may be used for elements of the same type. The figures are schematic representations that, for the sake of legibility, are not to scale. In particular, the thicknesses of the layers along the z axis are not to scale in relation to the lateral dimensions along the x and y axes.

Figure 1:
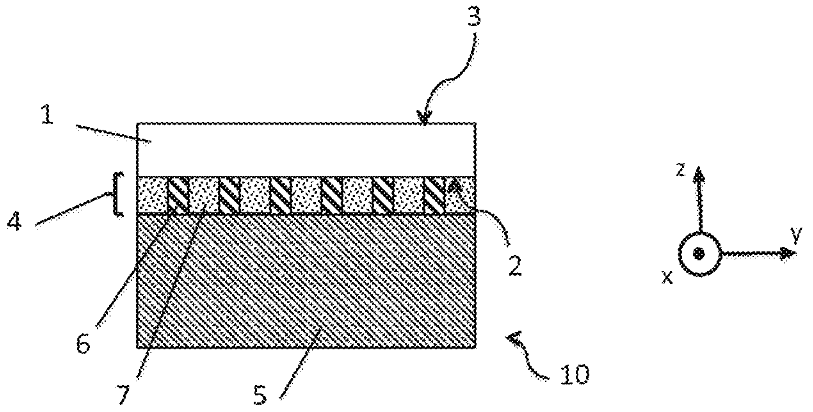
FIG. 1 shows a hybrid structure according to the disclosure.

The disclosure relates to a hybrid structure 10 suitable for manufacturing a surface acoustic wave (SAW) device, comprising a useful layer 1 of piezoelectric material, having a first face 2 and a second face 3, as illustrated in FIG. 1. The hybrid structure 10 also includes an intermediate layer 4 arranged under the useful layer (along the z axis shown in FIG. 1), in contact with the first face 2. The intermediate layer 4 is a structured layer of a thickness e, formed of at least two different materials. The term "structured layer" implies a layer composed of periodic motifs in the plane of the layer (i.e., in the plane (x, y) in FIG. 1). These motifs correspond to blocks of defined lateral dimensions (i.e., the dimensions in the plane (x, y)) and of a thickness (i.e., along the z axis) less than or equal to comprising at least two different materials. According to the example illustrated in FIG. 1, the intermediate layer 4 is composed of first motifs 6 formed of a first material and of second motifs 7 (complementary to the first motifs 6) formed of a second material. In the plane (x, y), the first and second motifs 6 and 7 are of defined shape (square, rectangle, circle, . . . ) and have defined lateral dimensions.

Finally, the hybrid structure 10 comprises a carrier substrate 5 having a thermal expansion coefficient lower than that of the useful layer 1, arranged under the intermediate layer 4 (along the z axis shown in FIG. 1). The useful layer 1 of the hybrid structure 10 may be composed of a material selected from the following group: lithium tantalate ($LiTaO_3$), lithium niobate ($LiNbO_3$), aluminum nitride (AlN) and zinc oxide (ZnO). The carrier substrate 5 may be composed of a material selected from the following group: silicon, III-V semiconductors, silicon carbide, glass and sapphire.

Figure 2:
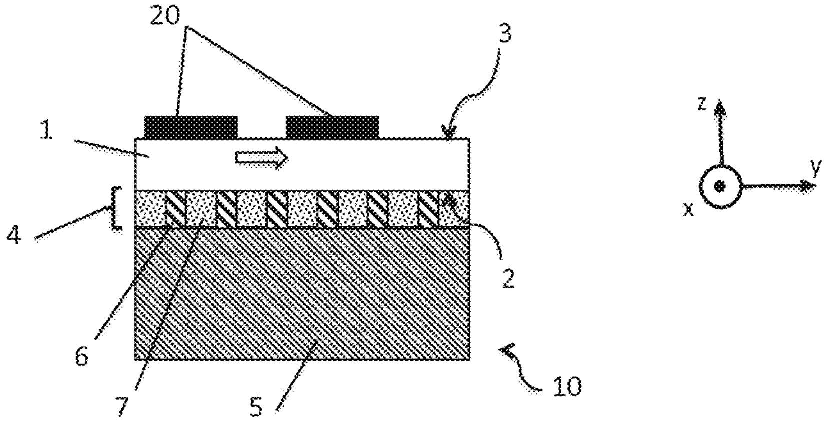
FIG. 2 shows a hybrid structure according to the disclosure comprising a SAW device.

As illustrated in FIG. 2, the hybrid structure 10 is suitable for manufacturing surface acoustic wave (SAW) devices comprising, in particular, metallic electrodes 20 on the useful layer 1, between which the acoustic signal propagates. The direction of propagation of the acoustic signal is illustrated by the arrow, in the direction of the y axis, in the example in FIG. 2.

According to one embodiment of the hybrid structure 10 of the disclosure, the intermediate layer 4 consists of two materials: the first material (composing the first motifs 6) is that of the useful layer (piezoelectric material); the second material (composing the second motifs 7) is of the same type as the carrier substrate of the hybrid structure 10. The thickness e of the intermediate layer 4 is greater than the wavelength, of the acoustic signal used by the SAW device; typically, the thickness e may be between 2λ and 50λ. This characteristic ensures that the acoustic wave that propagates in the layer of piezoelectric material may be influenced by the intermediate layer 4. Furthermore, at least one lateral dimension (the dimension along the axis of propagation of the acoustic wave in the device) of the first and second periodic motifs is smaller than the wavelength; typically, it may be between λ/2 and λ/50.

On the scale of the acoustic wave, the intermediate layer, therefore, appears as a composite material, comprising the first and second materials. The lateral dimensions of the periodic motifs are selected such that the acoustic impedance of the intermediate layer 4 is substantially equal to the square root of the product of the acoustic impedances of the useful layer 1 and of the carrier substrate 5. It should be remembered that the acoustic impedance Z of a material is expressed as:

$$Z = v.\rho = \sqrt{\frac{E}{3(1-2v)\rho}}.\rho = \sqrt{\frac{E.\rho}{3(1-2v)}}$$

where v is the velocity of the acoustic wave in the material, ρ is the density of the material, E and v are respectively Young's modulus and the Poisson's ratio of the material.

In the case of the intermediate layer 4, one considers the volumetric fractions $V_1$ and $V_2$ of each of the materials of which it is composed and its acoustic impedance can be expressed as:

$$Z_{intermediate\ layer} = \sqrt{\left[\left(\frac{E_1 V_1}{3(1-2v_1)}\right) + \left(\frac{E_2 V_2}{3(1-2v_2)}\right)\right] \times [(\rho_1 V_1) + (\rho_2 V_2)]}$$

where $\rho_1$ and $\rho_2$ are, respectively, the density of the first and the second material, $E_1$ and $E_2$ are, respectively, the Young's modulus of the first and second material and $v_1$ and $v_2$ are the Poisson's ratio of the first and second material.

The volumetric fractions $V_1$ and $V_2$ are defined by the thickness e of the intermediate layer 4 and the lateral dimensions of the first and second motifs 6, 7.

The characteristics of the intermediate layer 4 (first and second material, lateral dimensions of the periodic motifs) are thus defined such that its mean acoustic impedance is as close as possible to the square root of the product of the acoustic impedances of the useful layer 1 and of the carrier substrate 5:

$$Z_{intermediate\ layer} \cong \sqrt{Z_{useful\ layer} \times Z_{substrate}}$$

This configuration favors transmission of the portion of acoustic waves usually reflected at the interfaces of a hybrid structure (by adaptation of acoustic impedance) from the useful layer 1 toward the carrier substrate 5. It thus makes it possible to drastically reduce the parasitic reflections negatively impacting the frequency characteristics of the SAW device produced on the hybrid structure 10.

Figure 3A:
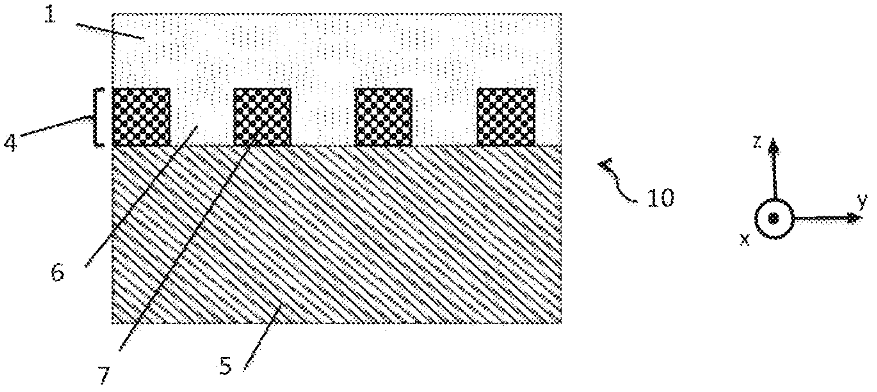
FIGS. 3*a* and 3*b* show a hybrid structure according to an embodiment in accordance with the disclosure.

According to a second embodiment of the hybrid structure 10 according to the disclosure, the intermediate layer 4 likewise consists of two materials (FIG. 3*a*) but exhibits different physical characteristics from those of the first embodiment. On the one hand, the thickness e of the intermediate layer is equal to or substantially less than the wavelength, of the acoustic signal used for the SAW device, for example, between λ and λ/8. On the other hand, at least one lateral dimension (that along the axis of propagation of the acoustic wave in the device) of the periodic motifs is smaller than or equal to the wavelength λ of the acoustic wave; typically, it may be between λ/10 and λ. This configuration promotes interaction between the acoustic wave and the intermediate layer 4. In particular, the portion of acoustic wave usually reflected at the interfaces of the hybrid structure will be advantageously diffused by the intermediate layer 4. This will result in substantial restriction of the reflected component of the acoustic wave causing the parasitic effects.

Figure 3B:
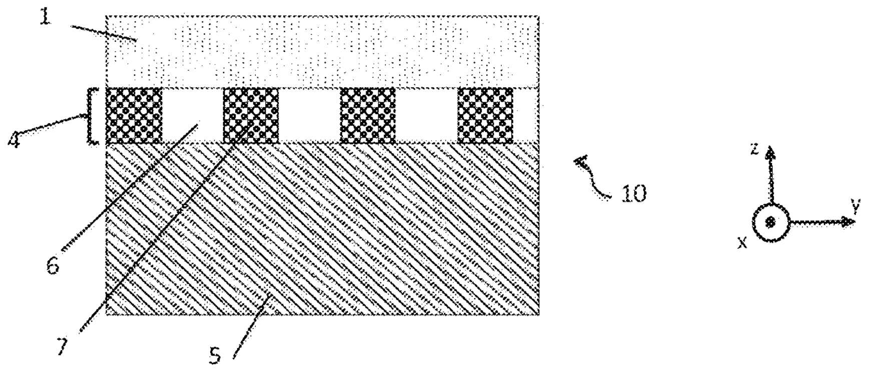

According to a variant of the second embodiment of the disclosure, the intermediate layer may consist of air or gas (at the level of the first motifs 6 forming cavities) and of a second material (at the level of the second motifs 7) (FIG. 3*b*). For example, the second motifs 7 may be formed of the same material as the carrier substrate 5. Advantageously, the materials constituting the first and second motifs, respectively, will be chosen so as to generate an acoustic contrast between the first and second motifs.

The lateral dimensions of the first and second motifs (and, therefore, the periodicity of the motifs) are defined according to the frequency of the acoustic wave characteristic of the SAW device, in addition to the thickness of the intermediate layer 4 and, moreover, in order to transmit or diffuse the acoustic waves normally reflected on the interfaces of the hybrid structure.

Figure 4A:
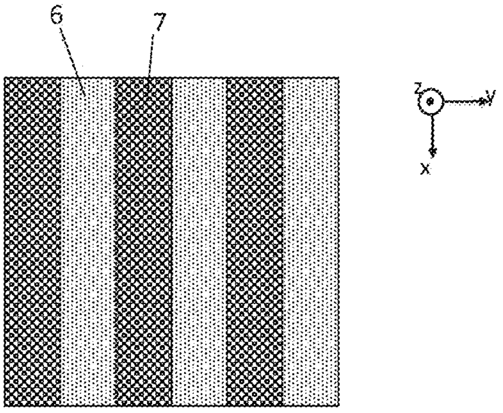
FIGS. 4*a* to 4*d* show examples of periodic motifs of the intermediate layer of a hybrid structure according to the disclosure.
Figure 4B:
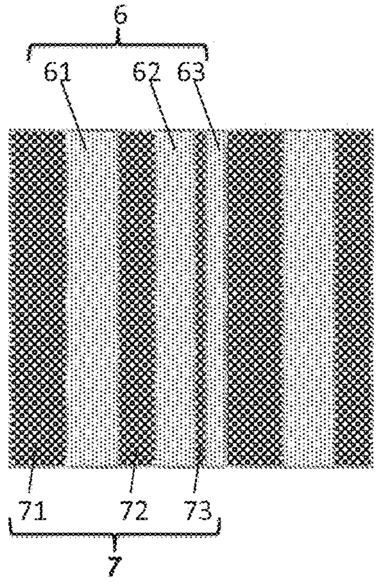

FIGS. 4*a* to 4*d* show variants of arrangement of the periodic motifs 6, 7 of the intermediate layer 4. In the example in FIG. 4*a*, showing a top view of the intermediate layer 4, in the plane (x, y), the first motifs 6 and the second motifs 7 are strip shaped. It should be remembered that in this case, the SAW device must be produced such that propagation of the acoustic waves occurs parallel to the y axis, i.e., perpendicularly to the strips. The lateral dimensions along the y axis (width of the strips) of the first and second motifs will be selected according to the embodiments (less than or substantially equal to the wavelength of the acoustic wave). According to an alternative solution in FIG. 4*b*, the dimension of several consecutive first motifs 6 is different. For example, an alternation of first motifs 6 with strips 61, 62, 63 of different widths along the y axis is observed. A similar alternation can also be performed on the second motifs 7 with strips 71, 72, 73 of different widths. This alternation is periodically repeated over the entire surface of the intermediate layer 4. A configuration of this kind is particularly favorable in the second embodiment of the disclosure in diffusing the acoustic waves over a wider frequency range.

Figure 4C:
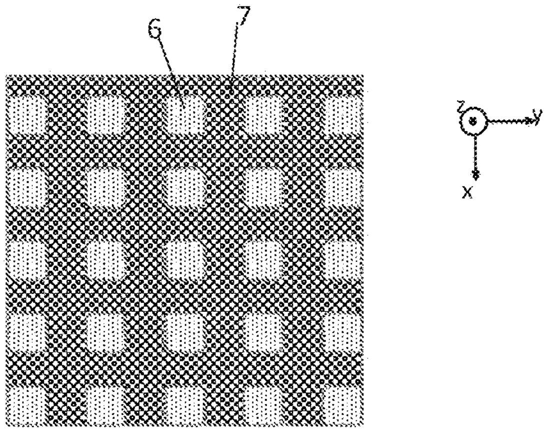
Figure 4D:
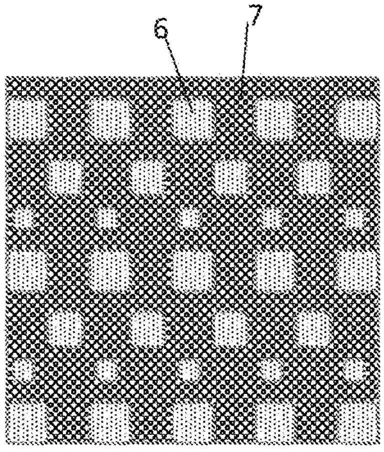

According to another alternative solution illustrated in FIG. 4*c*, the first motifs are pads, which are square shaped, for example, the dimensions of which along the x axis and y axis are defined according to the criteria of the first or second embodiments of the disclosure. The second motifs are the motifs complementary to the first motifs in the plane (x, y). Such an arrangement of motifs makes the hybrid structure 10 independent from the orientation of the devices and from the direction of propagation of the acoustic waves. According to another alternative solution in FIG. 4*d*, the first motifs are squares of different dimensions, repeated periodically. A configuration of this kind is interesting in the second embodiment of the disclosure in diffusing the acoustic waves over a wider frequency range.

Figure 5A:
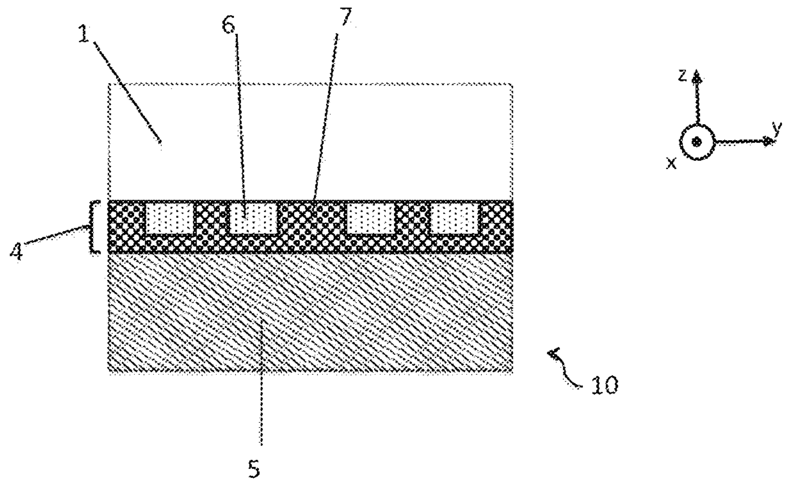
FIGS. 5*a* to 5*c* show cross-sectional views of examples of motifs of the intermediate layer of a hybrid structure according to the disclosure.
Figure 5B:
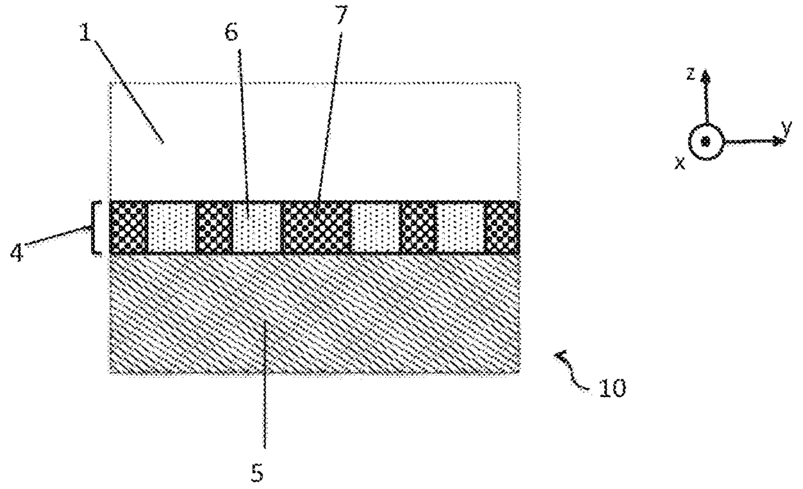
Figure 5C:
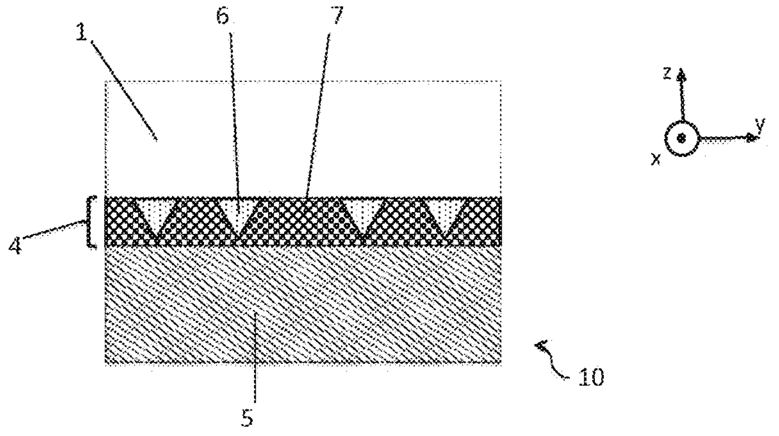

FIGS. 5*a* to 5*c* show cross-sectional views of hybrid structures according to the disclosure. The periodic motifs 6, 7 of the intermediate layer 4 may have different shapes along the z axis. According to one alternative version, the periodic motifs 6, 7 form slots (FIGS. 5*a* and 5*b*); the first motifs 6 have dimensions along z less than or equal to the thickness of the intermediate layer 4. According to another alternative solution (FIG. 5*c*), the periodic motifs 6 form V-shaped motifs, capable of optimizing diffusion of the spurious waves by orienting the reflection planes between the motifs in the intermediate layer 4.

The examples mentioned are, of course, not exhaustive and the motifs may be of various shapes in the plane (x, y) or in a perpendicular plane without going beyond the ambit of the disclosure.

According to an alternative solution applicable to the first or second embodiment of the hybrid structure 10, the intermediate layer may be formed of three or more different materials.

The disclosure also relates to a method of manufacturing a hybrid structure 10 for a surface acoustic wave device. The method comprises a first stage of providing a useful layer 1 of piezoelectric material. According to an advantageous mode of implementation, the useful layer adopts the form of a substrate of piezoelectric material, of a thickness and diameter standard in the micro-electronics industry (for example, a diameter of 150 mm and a thickness of 675 microns).

The first stage also comprises providing a carrier substrate 5 having a thermal expansion coefficient lower than that of the donor substrate (i.e., also that of the useful layer 1).

The manufacturing method according to the disclosure comprises a second stage involving local etching of a front face of the donor substrate according to periodic motifs, thereby forming a set of etched motifs and unetched motifs. With reference to the hybrid structure described above, the etched motifs may be either the first or the second motifs (the same applies to the unetched motifs). This etching stage can, for example, be carried out by dry or wet chemical attack, laser etching or another technique suitable for local etching of micrometric motifs. Prior to the etching stage, a photolithography stage can be performed to define the areas to be etched.

Alternatively, the second etching stage can be performed on a front face of the carrier substrate instead of on the donor substrate.

The manufacturing process comprises a third stage of applying, to the etched motifs, an additional layer of a second material different from the first material forming the non-etched motifs. This additional layer may be formed, for example, by chemical vapor deposition, chemical liquid deposition or by epitaxy, etc.

The unetched periodic motifs and the additional layer form the intermediate layer 4 of the hybrid structure 10 according to the disclosure. Advantageously, the depth of the etching (defining the height, along the z axis, of the unetched motifs) defines the thickness e of the intermediate layer 4. The additional layer can advantageously undergo a planarization or surface smoothing treatment prior to the next assembly stage.

The method comprises a fourth stage of assembly of the donor substrate and the carrier substrate 5, so that the intermediate layer 4 is arranged between these two substrates. Advantageously, the assembly stage is carried out by direct bonding, by molecular adhesion of the two surfaces placed in contact (i.e., without the surface of the intermediate layer 4 and the surface of the substrate having any intermediate layer). The principle of molecular adhesion, well known in the state of the art, will not be described in further detail. Alternatively, assembly can be carried out by adding a layer of adhesive material, or by any other bonding technique suitable for the intended application.

The manufacturing method according to the disclosure furthermore comprises a fifth stage of thinning the donor substrate to the desired thickness of the useful layer 1 for manufacture of the acoustic wave device. This stage may, for example, involve mechanical grinding, followed by dry or chemical mechanical polishing, ensuring a good surface finish for the useful layer 1. Various different cleaning sequences may, of course, be implemented during or after the thinning stage to guarantee the quality and cleanliness of the final hybrid structure 10.

Example 1

In an exemplary implementation of the disclosure, a donor substrate made of lithium niobate ($LiNbO_3$) and a carrier substrate 5 made of silicon, both having a diameter of 150 mm and a thickness of 675 microns, are provided. The resistivity of the carrier substrate will be selected, for example, to be greater than 1000 ohms·cm. The $LiNbO_3$ donor substrate undergoes a photolithography stage to define the motifs: the first motifs 6 are defined as the areas not to be etched; the second motifs 7 are defined as the motifs to be etched. The first motifs correspond to 0.3-micron-square tabs, spaced 0.2 microns apart. The second motifs correspond to a grid between the tabs, the strip width of which is 0.2 microns, i.e., the area complementary to the tabs on the surface of the donor substrate. The stage of etching the surface of the donor substrate is performed by dry etching, over a depth of 5 microns. After removing the photolithography mask on the surface of the donor substrate and cleaning the latter (by an RCA sequence, for example, conventionally used in the micro-electronics industry), an additional layer of polycrystalline silicon is applied by CVD (chemical vapor deposition), for example.

In order to fill in the etched areas (second motifs), a thickness of between 6 and 12 microns, advantageously 8 microns, can be applied. A stage of planarization by chemical mechanical polishing is subsequently effected to eliminate any residual topologies and roughness following the application of p-Si.

The intermediate layer 4 consists of the first motifs 6 made of piezoelectric material and the additional layer (p-Si) filling the second motifs 7. In a first alternative solution, the thickness of the intermediate layer 4 corresponds to the etching depth, i.e., 5 microns in this example. In this case, the planarization stage will have allowed removal of the polycrystalline silicon from the surface of the donor substrate until flush with the first motifs (configuration illustrated in FIG. 5*b*). In a second alternative solution, the thickness e of the intermediate layer 4 is greater than the etching depth, since a thickness of the additional layer remains on the first motifs (configuration illustrated in FIG. 5*a*, wherein the additional layer is between and under the first motifs 6 in the final hybrid structure 10 represented in the figure). By way of example, the additional layer on top of the first motifs may be 1 micron in thickness and the intermediate layer will thus be 6 microns in thickness.

Once the surface of the donor substrate has been prepared, the stage of assembly with the carrier substrate 5 is performed. A sequence of cleaning the two substrates may be effected prior to assembly, particularly in the case of direct bonding by molecular adhesion, which is particularly sensitive to the presence of contamination or particles on the surfaces to be assembled. In order to increase the adhesion forces between the substrates, their surfaces may undergo oxygen or nitrogen plasma treatment before being placed in contact.

After bonding, low-temperature reinforcement annealing is carried out, usually within the range of 80° C.-120° C., given the major difference in thermal expansion between the materials of the assembled substrates.

A stage of mechanical thinning followed by a stage of chemical mechanical polishing of the rear face of the donor substrate is effected to obtain the useful layer of the hybrid structure, with a thickness of 20 microns.

The hybrid structure obtained is, therefore, composed of a useful layer of $LiNbO_3$ 20 microns in thickness, an intermediate layer of a thickness between 5 and 6 microns (according to the alternative solutions mentioned above) and composed of two materials: first motifs made of $LiNbO_3$ and second motifs made of polysilicon. The size of the first motifs in the plane (x, y) is 0.3 microns and their distance apart is 0.2 microns. The mean acoustic impedance of this layer is, therefore, approximately 1.5e6 g/cm$^2$/second, i.e., a value very close to the square root of the product of the impedances of the $LiNbO_3$ and silicon.

This hybrid structure is intended for manufacturing a surface acoustic wave device, the wavelength $\lambda$ of which is on the order of 2 microns. Given the limited thickness of the useful layer, a portion of the acoustic waves penetrates into the layer and propagates to reach the intermediate layer. These waves are usually reflected on the interfaces ($LiNbO_3$/Si, for example) and generate spurious waves impairing the performance of the device.

The configuration of the intermediate layer 4 of the hybrid structure 10 according to the disclosure promotes transmission toward the silicon carrier substrate 5 of the acoustic waves penetrating into the depth of the useful layer 1. The mean acoustic impedance of the intermediate layer 4 is properly suited to the surrounding materials ($LiNbO_3$ and Si). The thickness e of the intermediate layer 4 is greater than the wavelength of the acoustic wave of the device; the size and distance between the first motifs are smaller than the wavelength.

Furthermore, the hybrid structure 10 described herein has a significant advantage regarding the RF performance of the device. Indeed, the additional layer of polysilicon forms a trapping layer for the charges generated in the silicon carrier substrate 5 when the latter is subjected to high frequency signals. These charges are known to cause a drop in the resistivity of the carrier substrate 5, which negatively affects the linearity and insertion loss performances of the RF device. The additional layer of p-Si, therefore, plays a supplementary role as a trapping layer and neutralizes the charges generated in the carrier substrate 5.

Example 2

In another exemplary implementation of the disclosure, a donor substrate made of lithium tantalate ($LiTaO_3$) and a carrier substrate made of silicon, both having a diameter of 150 mm and a thickness of 675 microns are provided. The resistivity of the carrier substrate will be selected, for example >1000 ohms·cm. The $LiTaO_3$ donor substrate undergoes a photolithography stage to define the motifs (in the plane (x, y): the first motifs 6 are defined as the areas not to be etched; the second motifs 7 are defined as the motifs to be etched. The first motifs 6 correspond to strips 1.25 microns in width, spaced 1.25 microns apart. The second motifs 7 correspond to strips complementary to the strips of the first motifs 6, on the surface of the donor substrate. The stage of etching the surface of the donor substrate is performed by dry etching, over a depth of approximately 1.5 microns. After removing the photolithography mask on the surface of the donor substrate and cleaning the latter, an additional layer of silicon oxide is applied by CVD (chemical vapor deposition), for example. In order to fill in the etched areas (second motifs), a thickness of between 2 and 6 microns, advantageously 4 microns, will be applied. A stage of planarization by chemical mechanical polishing of the additional layer is subsequently effected to eliminate any residual topologies and roughness following the application of oxide.

The intermediate layer 4 consists of the first motifs 6 made of piezoelectric material ($LiTaO_3$) and the additional layer ($SiO_2$) filling the second motifs 7. In a first alternative solution, the thickness of the intermediate layer 4 corresponds to the etching depth, i.e., 1.5 microns in this example. In this case, the planarization stage will have allowed removal of the silicon oxide from the surface of the donor substrate until flush with the first motifs 6. In a second alternative solution, the thickness of the intermediate layer 4 is greater than the etching depth, since a thickness of the additional layer remains on the first motifs 6. For example, the additional layer on top of the first motifs 6 may be 0.5 microns in thickness and intermediate layer 4 will thus be 2 microns in thickness.

Once the surface of the donor substrate has been prepared, the stage of assembly with the carrier substrate is performed. A sequence of cleaning the two substrates may be effected prior to assembly, particularly in the case of direct bonding by molecular adhesion, which is particularly sensitive to the presence of contamination or particles on the surfaces to be assembled. In order to increase the adhesion forces between the substrates, their surfaces may undergo oxygen or nitrogen plasma treatment before being placed in contact.

After bonding, low-temperature reinforcement annealing is carried out, usually within the range of 80° C.-120° C., given the major difference in thermal expansion between the materials of the assembled substrates.

A stage of mechanical thinning followed by a stage of chemical mechanical polishing of the rear face of the donor substrate is effected to obtain the useful layer of the hybrid structure, with a thickness of 30 microns.

The hybrid structure obtained is, therefore, composed of a useful layer of $LiTaO_3$ 30 microns in thickness, an intermediate layer of a thickness between 1.5 and 2 microns (according to the alternative solutions mentioned above) and composed of two materials: first motifs made of $LiTaO_3$ and second motifs made of silicon oxide. The size of the first motifs in the y axis is 1.25 microns and their distance apart is 1.25 microns.

This hybrid structure 10 is intended for manufacturing a surface acoustic wave device, the frequency of which is within the range of 700-900 MHz, i.e., a wavelength on the order of 5 microns. Propagation of the acoustic waves will occur along the y axis. Given the limited thickness of the useful layer, a portion of the acoustic waves penetrates into the useful layer 1 and propagates to reach the intermediate layer 4. These waves are usually reflected on the interfaces ($LiTaO_3$/Si for example) and generate spurious waves impairing the performance of the device.

The configuration of the intermediate layer 4 of the hybrid structure 10 according to the disclosure promotes diffusion on the intermediate layer 4 of the acoustic waves penetrating into the useful layer 1 and, therefore, limits their reflection. The thickness e of the intermediate layer 4 is substantially less than the wavelength of the acoustic wave of the device; the size and distance between the first motifs are smaller than the wavelength.

Example 3

In another exemplary implementation of the disclosure, a donor substrate made of lithium tantalate ($LiTaO_3$) and a carrier substrate made of silicon, both having a diameter of 150 mm and a thickness of 625 microns are provided. The resistivity of the carrier substrate will be selected, for example, greater than 1000 ohms·cm. The carrier substrate undergoes a photolithography stage to define the motifs: the first motifs 6 are defined as the areas not to be etched; the second motifs 7 are defined as the motifs to be etched. The first motifs 6 correspond to strips 1.25 microns in width, spaced 1.25 microns apart. The second motifs correspond to strips complementary to the strips of the first motifs, on the surface of the carrier substrate. The stage of etching the surface of the carrier substrate is performed by dry etching, over a depth of 1 micron. After removing the photolithography mask on the surface, the carrier substrate is cleaned with a view to carrying out the stage of assembly with the donor substrate. No additional layer is applied in this third example. The first material (constituting the first motifs) is silicon and the second material is air or a gas depending on the atmosphere introduced into the bonding chamber during the assembly stage.

After bonding, low-temperature reinforcement annealing is carried out, usually within the range of 80° C.-120° C., given the major difference in thermal expansion between the materials of the assembled substrates.

A stage of mechanical thinning followed by a stage of chemical mechanical polishing of the rear face of the donor substrate is effected to obtain the useful layer of the hybrid structure, with a thickness of 20 microns.

The hybrid structure obtained is, therefore, composed of a useful layer of $LiTaO_3$ 20 microns in thickness, an intermediate layer of a thickness of 1 micron and composed of two materials: first motifs made of silicon and second motifs filled with air or gas. The size of the first motifs in the y axis is 1.25 microns and their distance apart is 1.25 microns.

This hybrid structure is intended for manufacturing a surface acoustic wave device, the frequency of which is 700-900 MHz, i.e., a wavelength on the order of 5 microns. Given the limited thickness of the useful layer, a portion of the acoustic waves penetrates into the layer and propagates to reach the intermediate layer 4. These waves are usually reflected on the interfaces ($LiTaO_3$/Si, for example) and generate spurious waves impairing the performance of the device.

The configuration of the intermediate layer 4 of the hybrid structure 10 according to the disclosure promotes diffusion on the intermediate layer 4 of the acoustic waves penetrating into the useful layer 1 and, therefore, limits their reflection. The thickness e of the intermediate layer 4 is substantially less than the wavelength of the acoustic wave of the device; the size and distance between the first motifs are smaller than the wavelength.

Of course, the disclosure is not limited to the described embodiments and examples and variant embodiments can be provided without leaving the scope of the disclosure as defined in the claims.

The hybrid structure 10 according to the disclosure can, in particular, be adapted to the manufacture of surface acoustic wave devices, the frequency of which is within the range of 700 MHz-3 GHz.

What is claimed is:

1. A hybrid structure for a surface acoustic wave device, comprising:
- a carrier substrate;
- a useful layer of piezoelectric material joined to the carrier substrate, the useful layer having a thermal expansion coefficient higher than that of the carrier substrate; and
- an intermediate layer between the useful layer and the carrier substrate, the intermediate layer comprising a structured layer having a plurality of periodic motifs in a plane of the intermediate layer, a periodicity of the plurality of periodic motifs corresponding with an operation frequency of surface acoustic waves of the surface acoustic wave device.

2. The hybrid structure of claim 1, wherein the carrier substrate comprises at least one material selected from among a group of materials consisting of: silicon, glass, silica, sapphire, alumina or aluminum nitride.

3. The hybrid structure of claim 1, wherein the useful layer comprises at least one piezoelectric material selected from among a group of piezoelectric materials consisting of: lithium tantalate ($LiTaO_3$), lithium niobate ($LiNbO_3$), quartz or zinc oxide (ZnO).

4. The hybrid structure of claim 1, wherein a mean acoustic impedance of the intermediate layer is equal to a square root of a product of acoustic impedances of the useful layer and the carrier substrate.

5. The hybrid structure of claim 1, wherein a thickness of the intermediate layer is greater than an operational wavelength of the surface acoustic waves of the surface acoustic wave device.

6. The hybrid structure of claim 1, wherein at least one lateral dimension of the plurality of periodic motifs is smaller than or equal to an operational wavelength of surface acoustic waves of the surface acoustic wave device.

7. A hybrid structure for a surface acoustic wave device, comprising:
- a carrier substrate;
- a useful layer of piezoelectric material joined to the carrier substrate; and
- an intermediate layer between the useful layer and the carrier substrate, the intermediate layer comprising first motifs and second motifs alternately and periodically formed in the intermediate layer, at least one lateral dimension of the first motifs and the second motifs is smaller than a wavelength of an acoustic signal used by the surface acoustic wave device.

8. The hybrid structure of claim 7, wherein the first motifs comprise a first material and the second motifs comprise a second material different than the first material.

9. The hybrid structure of claim 8, wherein the first motifs are formed from the same material as the useful layer and the second motifs are formed from the same material as the carrier substrate.

10. The hybrid structure of claim 9, wherein the carrier substrate comprises at least one material selected from among a group of materials consisting of: silicon, glass, silica, sapphire, alumina or aluminum nitride.

11. The hybrid structure of claim 9, wherein the useful layer comprises a piezoelectric material selected from among a group of piezoelectric materials consisting of: lithium tantalate ($LiTaO_3$), lithium niobate ($LiNbO_3$), quartz or zinc oxide (ZnO).

12. The hybrid structure of claim 7, wherein the first motifs and the second motifs are strip shaped and propagation of the acoustic signal is perpendicular to a longitudinal orientation of the first motifs and second motifs.

13. The hybrid structure of claim 12, wherein a lateral dimension of consecutive first motifs is different.

14. The hybrid structure of claim 7, wherein the first motifs are pads and the second motifs are complementary to the first motifs within a lateral plane.

15. The hybrid structure of claim 14, wherein the pads are square shaped.

16. The hybrid structure of claim 15, wherein the square-shaped pads of the first motifs are squares of different dimensions repeated periodically.

17. The hybrid structure of claim 7, wherein the first motifs have a thickness less than a thickness of the intermediate layer.

18. The hybrid structure of claim 7, wherein the first motifs are V-shaped motifs.

19. A hybrid structure for a surface acoustic wave device, a carrier substrate;

a useful layer of piezoelectric material joined to the carrier substrate; and an intermediate layer between the useful layer and the carrier substrate, the intermediate layer comprising first motifs and second motifs alternately and periodically formed in the intermediate layer, a thickness of the intermediate layer being greater than a wavelength of an acoustic signal used by the surface acoustic wave device.

20. The hybrid structure of claim 19, wherein at least one lateral dimension of the first motifs and the second motifs is smaller than or equal to an operational wavelength of surface acoustic waves of the surface acoustic wave device.

* * * * *